(12) United States Patent
Hong

(10) Patent No.: US 7,563,689 B2
(45) Date of Patent: Jul. 21, 2009

(54) METHOD FOR FABRICATING NONVOLATILE MEMORY DEVICE

(75) Inventor: Dong-Gyun Hong, Icheon-si (KR)

(73) Assignee: Hynix Semiconductor Inc, Icheon-Si, Kyoungki-Do (KR)

( * ) Notice: Subject to any disclaimer, the term of this patent is extended or adjusted under 35 U.S.C. 154(b) by 7 days.

(21) Appl. No.: 11/770,990

(22) Filed: Jun. 29, 2007

(65) Prior Publication Data

US 2008/0242044 A1 Oct. 2, 2008

(30) Foreign Application Priority Data

Mar. 31, 2007 (KR) .................. 10-2007-0032073

(51) Int. Cl.
*H01L 21/76* (2006.01)
(52) U.S. Cl. ................ 438/426; 438/425; 438/424; 438/637; 438/E21.456
(58) Field of Classification Search ......... 438/424–428, 438/257–259, 201, 734–736, 593; 435/593
See application file for complete search history.

(56) References Cited

U.S. PATENT DOCUMENTS 7,344,942 B2 * 3/2008 Korber ................ 438/257

2003/0199149 A1 * 10/2003 Lee et al. ................ 438/424

FOREIGN PATENT DOCUMENTS

| KR | 10-2006-0005168 | 1/2006 |
| KR | 10-2007-0000603 | 1/2007 |
| KR | 10-2007-0002479 | 1/2007 |

* cited by examiner

*Primary Examiner*—Dung A. Le
(74) *Attorney, Agent, or Firm*—Marshall, Gerstein & Borun LLP

(57) ABSTRACT

A method for fabricating a nonvolatile memory device includes forming a gate insulation layer, a first gate conductive layer, a first sacrificial layer, and a second sacrificial layer over a substrate, etching the first and second sacrificial layers, the first gate conductive layer, the gate insulation layer, and the substrate to form trenches, forming a first insulation layer to fill the trenches, polishing the first insulation layer using the etched second sacrificial layer as a polish stop layer, removing the second sacrificial layer, recessing the first insulation layer inside the trenches, forming a second insulation layer to fill a space produced inside the trenches by the recessing of the first insulation layer, and polishing the second insulation layer using the etched first sacrificial layer as a polish stop layer.

29 Claims, 13 Drawing Sheets

METHOD FOR FABRICATING NONVOLATILE MEMORY DEVICE

CROSS-REFERENCE TO RELATED APPLICATION

The priority of Korean patent application number 10-2007-0032073, filed on Mar. 31, 2007, the disclosure of which is incorporated by reference in its entirety, is claimed.

BACKGROUND OF THE INVENTION

The invention relates to a method for fabricating a nonvolatile memory device and, more particularly, to a method for fabricating an NAND flash memory device implemented with an advanced self-aligned shallow trench isolation (ASA-STI) method.

There is a great demand for flash memory devices that can electronically program and erase data without periodically refreshing data. In an attempt to develop a large capacity memory device that can store a large amount of data, many researchers are particularly focusing on improving the level of integration of semiconductor memory devices.

NAND flash memory devices are suggested as one approach to achieve a higher level of integration in the semiconductor memory devices. In general, an NAND flash memory device is configured with a string structure where a plurality of memory cells are connected in series and sources/drains are shared between the neighboring memory cells. Different from an NOR flash memory device, the NAND flash memory device sequentially reads information.

The programming and erasing operation of the NAND flash memory device proceeds with injecting or discharging electrons into or from a floating gate while controlling threshold voltages of memory cells according to a Fowler-Nordheim (F-N) tunneling mode. Currently, a method for fabricating a floating gate in a 60 nm-level NAND flash memory device is implemented with the aforementioned ASA-STI method due to the decrease of an overlay margin between an active region and a floating gate.

FIGS. 1A to 1F are cross-sectional views illustrating a conventional ASA-STI method. Referring to FIG. 1A, a tunnel oxide layer 101, a conductive layer 102 (e.g., a polysilicon layer) for use in a floating gate, a buffer oxide layer 103, and a pad nitride layer 104 are sequentially formed on a substrate 100. Referring to FIG. 1B, the pad nitride layer 104, the buffer oxide layer 103, the conductive layer 102, the tunnel oxide layer 101, and the substrate 100 are etched to form trenches 105. Reference numerals 100A, 101A, 102A, 103A, and 104A represent a patterned substrate, a patterned tunnel oxide layer, a patterned conductive layer, a patterned buffer oxide layer, and a patterned pad nitride layer, respectively.

Referring to FIG. 1C, a high density plasma (HDP) liner layer 106 is formed on the above resultant surface profile illustrated in FIG. 1B in a manner to fill a portion of the trenches 105 (see FIG. 1B). A polysilazane (PSZ) layer 107 is formed on the HDP liner layer 106 to completely fill the trenches 105 (see FIG. 1B). Reference letter T1 represents a thickness of the patterned pad nitride layer 104A.

Referring to FIG. 1D, the PSZ layer 107 is chemically and mechanically polished. Reference numerals 107A and 106A represents a planarized PSZ layer and a planarized HDP liner layer, respectively. During the above chemical mechanical polishing (CMP) step, a portion of the patterned pad nitride layer 104A may be removed. Reference numeral 104B and reference letter T2 denote a first remaining pad nitride layer and a thickness of the first remaining pad nitride layer, respectively.

Referring to FIG. 1E, each of the planarized PSZ layer 107A and the planarized HDP liner layer 106A is recessed to a certain depth inside the trenches 105 (see FIG. 1B), so that a remaining PSZ layer 107B remains in a concave shape inside the trenches 105 (see FIG. 1B). Reference numeral 106B represents a remaining HDP liner layer. A HDP layer 108 is formed on the remaining PSZ layer 107B in a manner to completely fill the trenches 105 (see FIG. 1B).

Referring to FIG. 1F, the HDP layer 108 (see FIG. 1E) is planarized by chemical mechanical polishing (CMP). Reference numeral 108A represents a planarized HDP layer. As a result, an isolation structure including the remaining HDP liner layer 106B, the remaining PSZ layer 107B and the planarized HDP layer 108A is provided. During the CMP step, a portion of the first remaining pad nitride layer 104B may be removed. Reference numeral 104C and reference letter T3 denote a second remaining pad nitride layer and a thickness of the second remaining pad nitride layer, respectively.

Although not illustrated, the isolation structure formed in a cell region where memory cells are formed is recessed to adjust an effective field oxide height (EFH). The term 'EFH' indicates a distance from the surface of the active region to a dielectric layer.

However, the conventional ASA-STI method may have the following limitations. The ASA-STI method may provide a high aspect ratio compared to a self-aligned shallow trench isolation (SA-STI) method implemented in semiconductor technology for a 70 nm-level or more. Thus, instead of forming the isolation structure with a single HDP layer as in the conventional SA-STI method, the isolation structure is formed in a stack structure including a HDP layer, a PSZ layer, and another HDP layer. In other words, the PSZ layer having a good gap-filling characteristic is formed to secure the gap-fill characteristic in a trench, and the HDP layer that has a higher level of hardness than that of the PSZ layer is formed to fill a remaining portion of the trench. This approach permits simpler control of subsequent processes including CMP and an etching step to adjust the EFH.

However, as illustrated in FIGS. 1D and 1F, in the case of forming the isolation structure in a stack structure including the remaining HDP liner layer 106B, the remaining PSZ layer 107B and the planarized HDP layer 108A, the CMP needs to be performed twice. In detail, the CMP is performed individually after the formation of the PSZ layer 107 and after the formation of the HDP layer 108. When performing the CMP step, the patterned pad nitride layer 104A functioning as a polish stop layer is also removed. However, this removal is not uniform throughout the wafer (i.e., substrate structure). Thus, the EFH may not be controlled uniformly throughout the wafer when etching to adjust the EFH.

FIGS. 2A and 2B illustrate transmission electron microscopic (TEM) images of devices formed through respective ASA-STI and SA-STI methods. In FIG. 2A, a cross-sectional view of the device formed through the ASA-STI method is illustrated. In FIG. 2B, a cross-sectional view of the device formed through the SA-STI method is illustrated. Reference labels "Active," "Fox," "F.G.," "1st P1," "2nd P1," and "ONO" represent an active region, a non-active region (i.e., isolation region), a floating gate, first and second polysilicon layers, and a dielectric layer, respectively.

As illustrated in FIG. 2A, the EFH of the device formed through the SA-STI method is higher than the EFH of the device formed through the ASA-STI method. The EFH decrease is not observed uniformly throughout the wafer; rather, the EFH is controlled irregularly depending on the pattern density because of a dishing incidence resulting from a difference in the pattern density. As described above, because the CMP needs to be performed at least twice according to the ASA-STI method, the resultant structure is prone to the dishing incidence. "Dishing" refers to the case where a polish target layer in one region is depressed more than the polish target layer in another region depending on the pattern density difference, so that the polish target layer has a dish shape.

FIG. 3 and FIGS. 4A and 4B illustrate graphs of EFH and threshold voltage distributions per wafer region of a device implemented with the conventional ASA-STI method. In particular, the graph in FIG. 3 shows the EFH distribution within a cell region of the wafer. The X and Y axes represent the number of active regions and the size of the EFH, respectively. The graphs in FIGS. 4A and 4B show the EFH distribution within a cell region of the wafer and the threshold voltage distribution. In FIG. 4A, the X and Y axes represent the number of bit lines and a threshold voltage after a programming operation, respectively, and in FIG. 4B, the X and Y axes represent a threshold voltage and the number of bit lines, respectively.

As illustrated in FIG. 3 and FIGS. 4A and 4B, the EFHs have different sizes for each wafer region. Particularly, a high threshold voltage is observed in an edge region, which is a region where the EFH is adjusted to be the smallest compared to other regions. In detail, as shown in FIG. 4B, when a programming operation is implemented according to an incremental step pulse programming (ISPP) scheme, the cell with low EFH is first completed with the programming operation. Thus, after the programming operation, the threshold voltage of the cell is higher than the other cells.

FIGS. 5A and 5B illustrate TEM images of an EFH within a cell region. In FIG. 5A, a cross-sectional view of an edge portion of the cell region is illustrated. In FIG. 5B, a cross-sectional view of a central portion of the cell region is illustrated. The EFH in the edge portion of the cell region is smaller than the EFH in the central portion thereof.

FIG. 6 illustrates a TEM image of a cell to show limitations associated with a decrease in EFH. The non-uniformity in the EFH within the wafer region may also cause a punch-through event in a dielectric layer interposed between the neighboring floating gates. The dielectric layer is likely to be damaged in the region where the EFH is low. Thus, an electric short circuit event in which a control gate and a substrate are directly connected together may occur. If the electric short circuit occurs, leakage current is likely to occur in this region. The leakage current may impede a stable programming or erasing operation, and this adverse effect may result in device failure, which in turn may decrease device yields.

SUMMARY OF THE INVENTION

Embodiments of the invention provide a method for fabricating a nonvolatile memory device that can minimize non-uniformity in an effective field oxide height (EFH) in a wafer region, thereby improving the uniformity in a threshold voltage.

Embodiments of the invention also provide a method for fabricating a nonvolatile memory device that can prevent punch-through events in a dielectric layer caused by a decrease in EFH in a cell region.

In accordance with one aspect of the invention, a method for fabricating a nonvolatile memory device is provided. The method includes forming a gate insulation layer, a first gate conductive layer, a first sacrificial layer, and a second sacrificial layer over a substrate, etching the first and second sacrificial layers, the first gate conductive layer, the gate insulation layer, and the substrate to form trenches, forming a first insulation layer to fill the trenches, polishing the first insulation layer using the etched second sacrificial layer as a polish stop layer, removing the second sacrificial layer, recessing the first insulation layer inside the trenches, forming a second insulation layer to fill a space produced inside the trenches by the recessing of the first insulation layer, and polishing the second insulation layer using the etched first sacrificial layer as a polish stop layer.

In accordance with another aspect of the invention, a method for fabricating a nonvolatile memory device including a cell region and a peripheral region is provided. The method includes forming a gate insulation layer, a first gate conductive layer, a first sacrificial layer, and a second sacrificial layer over a substrate including the cell region and the peripheral region, etching the first and second sacrificial layers, the first gate conductive layer, the gate insulation layer, and the substrate to form trenches, forming a first insulation layer to fill the trenches, polishing the first insulation layer using the etched second sacrificial layer as a polish stop layer, removing the patterned second sacrificial layer, recessing the first insulation layer to a specified thickness inside the trenches, forming a second insulation layer to fill a space of the trenches produced by the recessing of the first insulation layer, polishing the second insulation layer using the etched first sacrificial layer as a polish stop layer, and recessing the second insulation layer formed in the cell region using the patterned first sacrificial layer as an etch barrier.

DESCRIPTION OF SPECIFIC EMBODIMENTS

In the following drawings, the thickness of layers and regions are exaggerated for clarity of the description, and when it is described that one layer is formed on another layer or a substrate, the term "on" indicates that the layer may be formed directly on the other layer or the substrate, or a third layer may be interposed therebetween.

FIGS. 7A to 7H are cross-sectional views illustrating a method for fabricating a nonvolatile memory device in accordance with an embodiment of the invention. FIGS. 7A to 7H illustrate mainly an isolation structure formed in a cell region for the simplicity of the description, and the detailed description of the isolation structure is provided herein below.

Figure 7A:
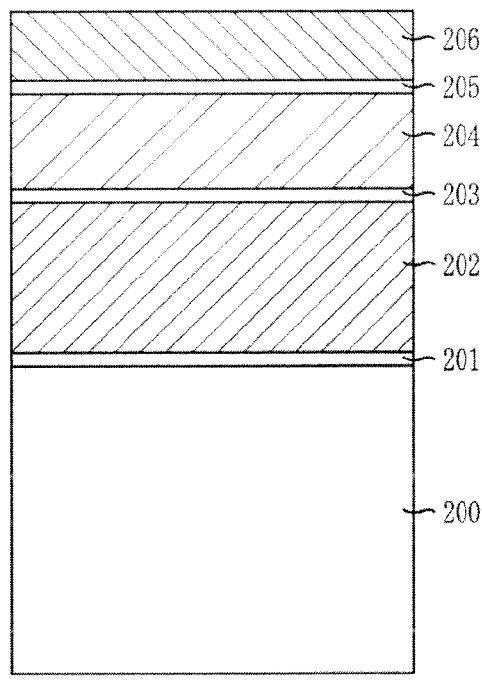
FIGS. 7A to 7H are cross-sectional views illustrating a method for fabricating a nonvolatile memory device in accordance with an embodiment of the invention.

Referring to FIG. 7A, although not illustrated, a triple N-type well is formed in a P-type substrate 200, and a P-type well is formed inside the triple N-type well. An ion implantation process for adjusting a threshold voltage is performed thereon.

A gate insulation layer 201 where an F-N tunneling takes place is formed over the substrate 200. The gate insulation layer 201 includes an oxide-based material such as silicon dioxide ($SiO_2$) or a stack structure including an oxide-based material and a nitride-based material. Also, the gate insulation layer 201 is formed by dry oxidation, wet oxidation or radical oxidation.

A conductive layer 202 functioning as a floating gate is formed over the gate insulation layer 201. The conductive layer 202 includes a conductive material including one or more selected from the group consisting of polysilicon, transition metals, and rare earth metals.

For instance, if polysilicon is selected, impurity-undoped polysilicon or impurity-doped polysilicon can be used. For the impurity-undoped polysilicon, impurity ions are additionally implanted through an ion implantation treatment. Such a polysilicon layer is formed by a low pressure chemical vapor deposition (LPCVD) method using a source gas of $SiH_4$ and a doping gas of $PH_3$, $BCl_3$ or $B_2H_6$. The transition metal is selected from the group consisting of iron (Fe), cobalt (Co), tungsten (W), nickel (Ni), palladium (Pd), platinum (Pt), Molybdenum (Mo), and titanium (Ti). The rare earth metal is selected from a group consisting of erbium (Er), ytterbium (Yb), samarium (Sm), yttrium (Y), lanthanum (La), cerium (Ce), terbium (Tb), dysprosium (Dy), holmium (Ho), thulium (Tm), and lutetium (Lu).

A first buffer layer 203 is formed over the conductive layer 202. The first buffer layer 203 includes an oxide-based material, and protects the conductive layer 202 against stress generated during formation of a first padding layer 204, which is to be formed later. For instance, if the conductive layer 202 includes polysilicon, the first buffer layer 203 includes a $SiO_2$ layer obtained through oxidation to minimize damage on the surface of the polysilicon layer. When using the transition metal or rare earth metal, the $SiO_2$ layer is used as the first buffer layer 203.

The first buffer layer 203 is not limited to an oxide-based material. Rather, the first buffer layer 203 can also include a material that can be simply formed with minimizing the damage on the conductive layer 202, protects the conductive layer 202 against stress generated when the first padding layer 204 is formed, and can be easily removed by a subsequent process.

The aforementioned first padding layer 204 (hereinafter referred to as a first sacrificial layer) is formed over the first buffer layer 203. The first sacrificial layer 204 protects the conductive layer 202 from an etching implemented to form trenches and simultaneously serves as a polish stop layer for a subsequent CMP.

The first sacrificial layer 204 is formed using a LPCVD method to minimize the damage on the conductive layer 202 when the first buffer layer 203 is not formed over the conductive layer 202. In the illustrated embodiment, the first sacrificial layer 204 includes a nitride-based material having a high etch selectivity ratio relative to polysilicon. However, the use of the nitride-based material is one exemplary implementation. The first sacrificial layer 204 can include any material that has sufficient resistance to the subsequent CMP and etching treatments and high etch selectivity relative to the conductive layer 202.

A second buffer layer 205 is formed over the first sacrificial layer 204. The second buffer layer 205 includes an oxide-based material. The second buffer layer 205 serves as an etch barrier layer when a subsequent second padding layer 206 (hereinafter referred to as a second sacrificial layer) is removed. Thus, the second buffer layer 205 includes a material providing an etch selectivity relative to the second sacrificial layer 206. If the second sacrificial layer 206 includes a nitride-based material, then the second buffer layer 205 includes an oxide-based material. In addition to this exemplary material, the second buffer layer 205 can include a photosensitive material or an amorphous carbon-based material.

The aforementioned second sacrificial layer 206 is formed over the second buffer layer 205. As described above, the second sacrificial layer 206 includes a material that has a high etch selectivity ratio relative to the second buffer layer 205. For instance, the second sacrificial layer 206 can include substantially the same material as the first sacrificial layer 204. With respect to the aspect ratio, the second sacrificial layer 206 is formed thinly. However, the second sacrificial layer 206 is formed to a certain thickness that can function as a polish stop layer during a subsequent CMP treatment. For instance, the second sacrificial layer 206 is formed to a thickness of about 300 Å.

The gate insulation layer 201, the conductive layer 202, the first and second buffer layers 203 and 205, and the first and second sacrificial layers 204 and 206 are formed in-situ substantially in the same chamber by changing process temperatures and gases.

Figure 7B:
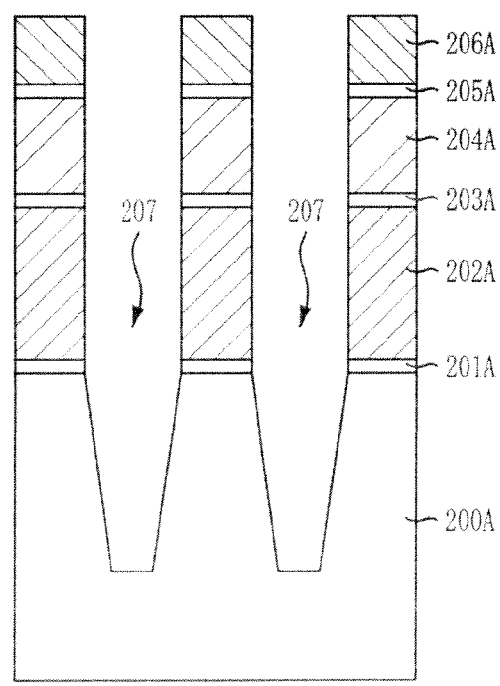

Referring to FIG. 7B, trenches 207 are formed. In detail, although not illustrated, a hard mask layer is formed over the second sacrificial layer 206. The hard mask layer is formed in a single layer structure including an oxide-based material or a stack structure including an oxide-based material and an amorphous carbon-based material. An anti-reflective coating layer such as a silicon oxynitride (SiON) layer is formed over the hard mask layer. A photoresist pattern is formed using photolithography. The anti-reflective coating layer and the hard mask layer are patterned using the photoresist pattern as an etch mask to form a hard mask pattern. The photoresist pattern and the patterned anti-reflective coating layer are removed. The second sacrificial layer 206, the second buffer layer 205, the first sacrificial layer 204, the first buffer layer 204, the conductive layer 202, the gate insulation layer 201, and the substrate 200 are etched using the hard mask pattern to form a patterned substrate 200A, a patterned gate insulation layer 201A, a patterned conductive layer 202A, a patterned first buffer layer 203A, a patterned first sacrificial layer 204A, a patterned second buffer layer 205A, and a patterned second sacrificial layer 206A.

Figure 7C:
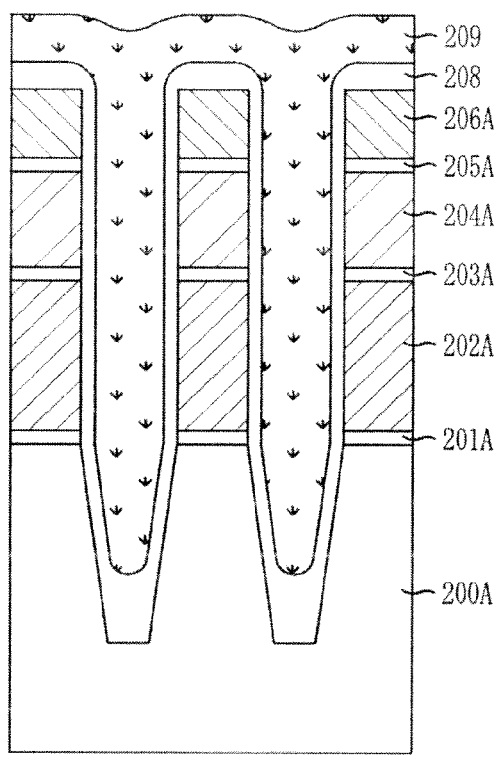

Referring to FIG. 7C, a liner layer 208 serving as an insulation layer is formed to fill a portion of the trenches 207 (see FIG. 7B). The liner layer 208 includes a high density plasma (HDP) layer. However, the liner layer 208 is not limited to the HDP layer; rather, the liner layer 208 can include any material that has good gap-fill characteristics even at high aspect ratios.

Although not illustrated, prior to forming the liner layer 208, an insulation layer (e.g., an oxide-based layer) may be formed on sidewalls of the trenches 207 to protect portions damaged when etching to form the trenches 207. The insulation layer includes an oxide-based material. For instance, the oxide-based layer may be a $SiO_2$ layer formed through oxidation.

A first insulation layer 209 is formed over the liner layer 208 to fill the trenches 207. For instance, the first insulation layer 209 includes a spin-on glass (SOG) layer. A polysilazane (PSZ) layer can be used as the SOG layer. In addition to the PSZ layer, the SOG layer can include any material that can be coated by a SOG method.

Table 1 below shows exemplary materials that can be coated by the SOG method.

TABLE 1

| Deposition Type | Organic-based material | Inorganic-based material |
| --- | --- | --- |
| SOG | SILK ™ (Dow Chemical, k = 2.6) | FOX (Dow Chemical, HSSQ, k = 3.0) |
| | BCB (Dow Chemical, k = 2.7) | HOSP (Honeywell, MSSQ, k = 2.6) |
| | FLARE ™ (Honeywell, k = 2.8) | JSR (LKD-T200, k = 2.6) |

In Table 1, "SILK™," "BCB," "FLARE™," "FOX," "HOSP," and "JSR" represent the product names. Also, "HSSQ" and "MSSQ" represent "hydrogen silsesquioxane," and "methyl silsesquioxane," respectively.

Figure 7D:
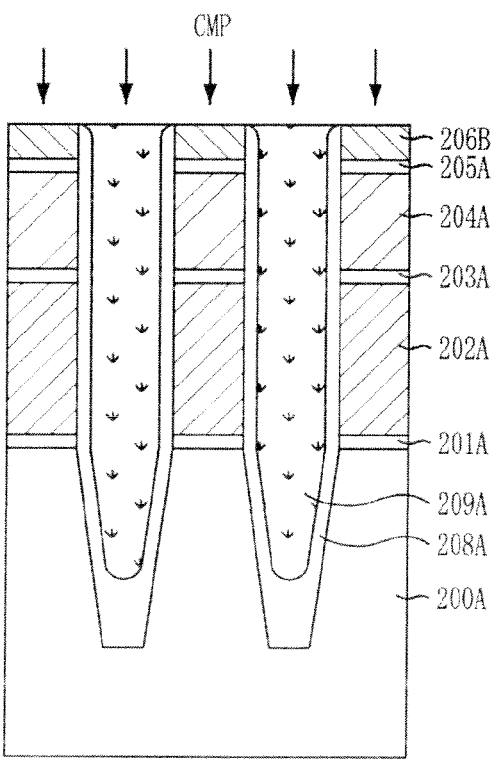

Referring to FIG. 7D, the first insulation layer 209 and the liner layer 208 are planarized by performing CMP using the patterned second sacrificial layer 206A as a polish stop layer. The CMP proceeds using slurry having a polish selectivity ratio between the patterned second sacrificial layer 206A and the liner layer 208 and the first insulation layer 209. In other words, the slurry favors the removal of the liner layer 208 and first insulation layer 209. Reference numerals 208A and 209A represent a planarized liner layer and a planarized first insulation layer, respectively. Reference numeral 206B represents a remaining second sacrificial layer after the above CMP.

Figure 7E:
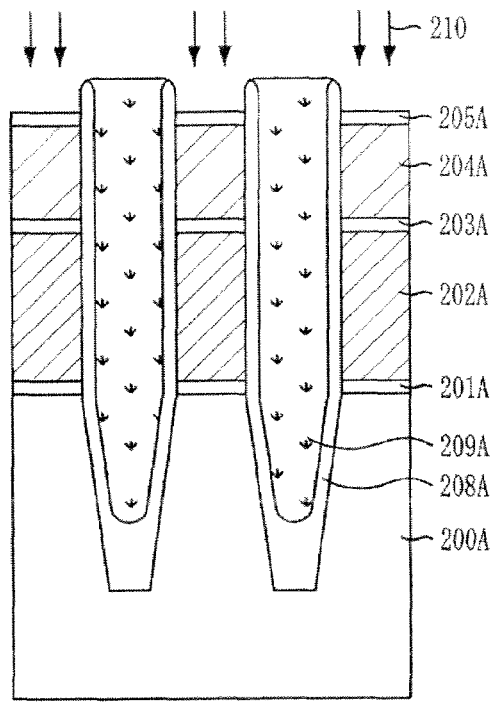

Referring to FIG. 7E, the remaining second sacrificial layer 206B is removed by an etching step 210. If the remaining second sacrificial layer 206B includes a nitride-based material, the etching step 210 is a wet-type etching using a solution of phosphoric acid ($H_3PO_4$) to increase the etch selectivity ratio between the remaining second sacrificial layer 206B and the patterned second buffer layer 205A.

Figure 7F:
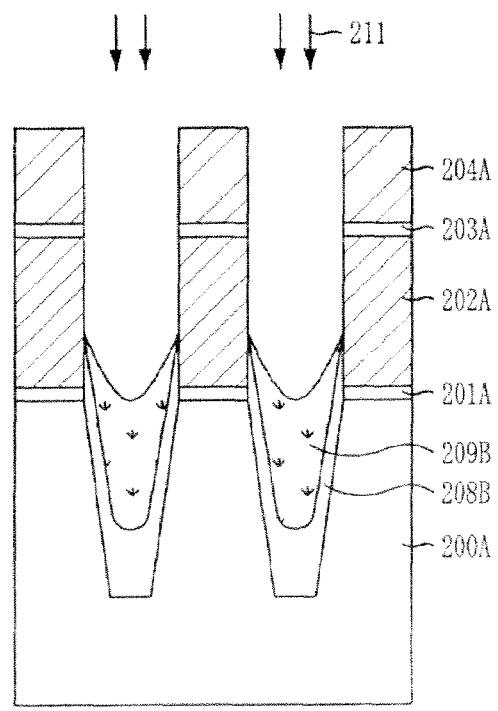

Referring to FIG. 7F, as reference numeral 211 indicates, the planarized first insulation layer 209A is etched to form a recessed first insulation layer 209B inside the trenches 207 (see FIG. 7B). The etching step 211 uses a solution of buffered hydrogen fluoride (BHF) or buffered oxide etchant (BOE), which is a mixture solution obtained by mixing HF with deionized water. Thus, the planarized liner layer 208A including an oxide-based material is also etched to form a recessed liner layer 208B, and the patterned second buffer layer 205A (see FIG. 7E) formed over the patterned first sacrificial layer 204A is also etched away.

Figure 7G:
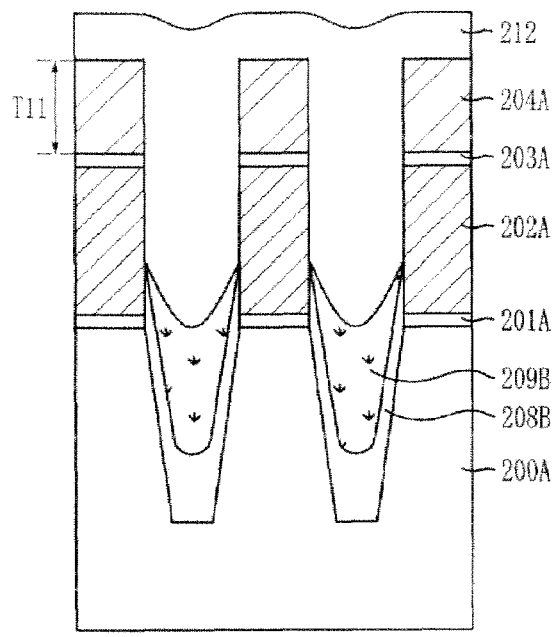

Referring to FIG. 7G, a second insulation layer 212 fills the space of the trenches 207 (see FIG. 7B) generated by forming the recessed first insulation layer 209B. The second insulation layer 212 includes a material having a favorable gap-fill characteristic and allowing an easier polish (planarization) because the material has a certain level of hardness when a planarization process (i.e., polishing process) is performed. A material obtained by HDP is one example of such a material. In addition to the HDP-based material, the second insulation layer 212 can also include a material selected alone or in combination from a group consisting of borophosphosilicate glass (BPSG), phosphosilicate glass (PSG), undoped silicate glass (USG), and tetraethyl orthosilicate (TEOS). Reference letter T11 denotes a thickness of the patterned first sacrificial layer 204A.

Figure 7H:
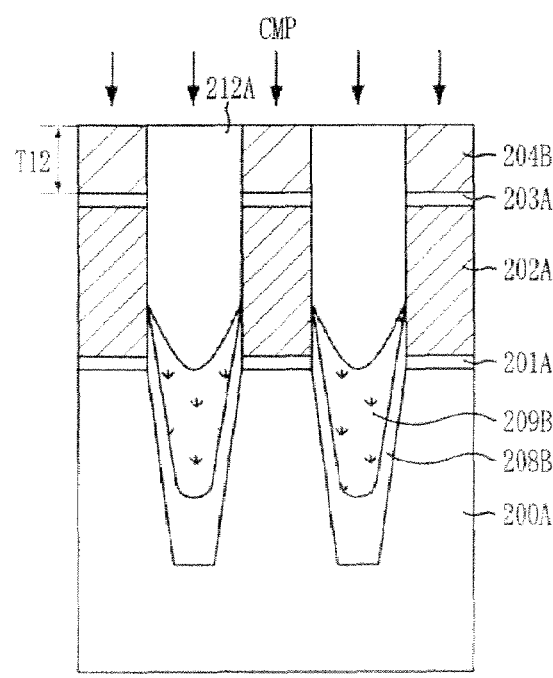

Referring to FIG. 7H, the second insulation layer 212 is planarized by performing CMP using the patterned first sacrificial layer 204A as a polish stop layer. Reference numeral 212A represents a planarized second insulation layer. Similar to the CMP illustrated in FIG. 7D, the CMP uses slurry having a polish selectivity ratio between the patterned first sacrificial layer 204A and the second insulation layer 212. In other words, the slurry favors the removal of the second insulation layer 212. As a result, an isolation structure including the recessed liner layer 208B, the recessed first insulation layer 209B and the planarized second insulation layer 212A is formed. Reference numeral 204B represents a remaining first sacrificial layer, and a thickness of the remaining first sacrificial layer 204B is labeled with reference letter T12.

Although not illustrated, the isolation structure formed in the cell region is recessed by etching using the remaining first sacrificial layer 204B as an etch barrier, thereby adjusting an effective field oxide height (EFH). At this time, a photoresist pattern opens the cell region where cells are formed and covers a peripheral region where driving circuits for driving the cells including a decoder and a page buffer are formed. The remaining first sacrificial layer 204B is removed. A dielectric layer and a control gate (i.e., another gate conductive layer) are formed over the patterned substrate 200A to form a gate. Since subsequent processes are substantially the same as the conventional processes, a detailed description thereof is omitted.

According to the illustrated embodiment, the isolation structure is formed by performing two CMP steps. In detail, a CMP is performed individually after the planarized first insulation layer 209A is formed as illustrated in FIG. 7D, and after the planarized second insulation layer 212A is formed as illustrated in FIG. 7H.

Figure 1A:
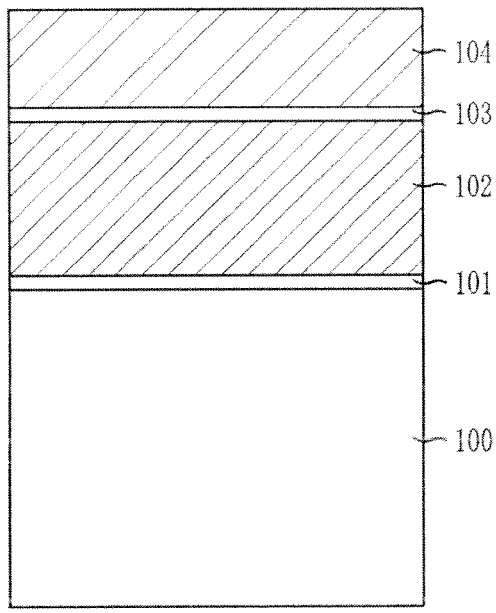
FIGS. 1A to 1F are cross-sectional views illustrating a method for fabricating an NAND flash memory device implemented with the conventional advanced self-aligned shallow trench isolation (ASA-STI) method.
Figure 1B:
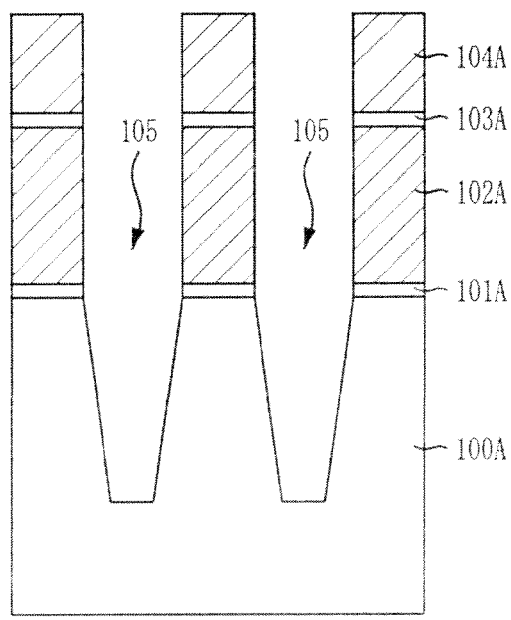
Figure 1C:
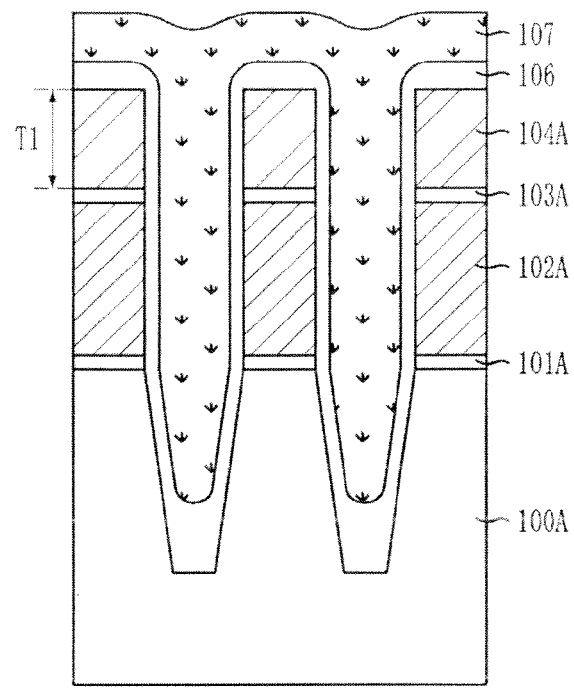
Figure 1D:
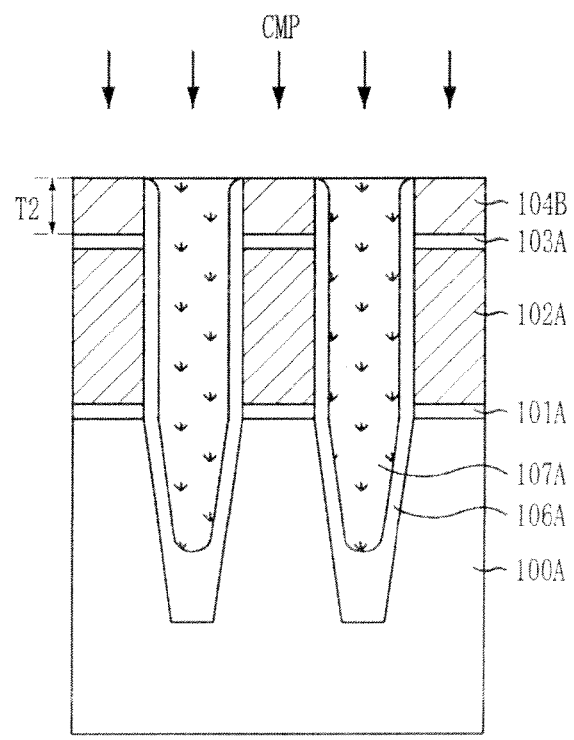
Figure 1E:
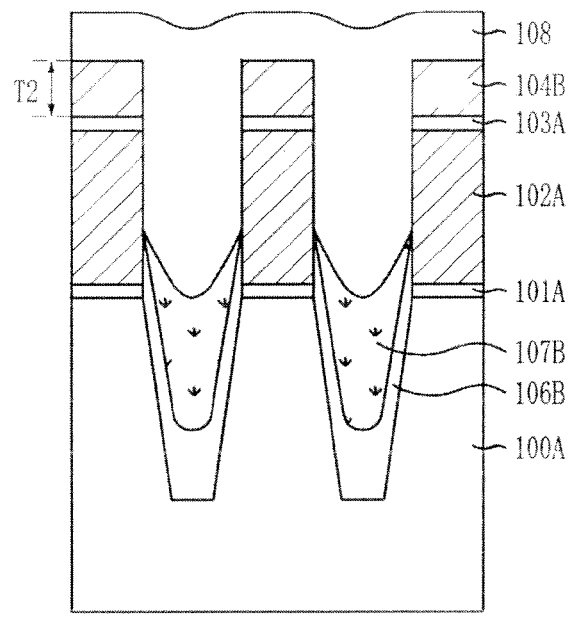
Figure 1F:
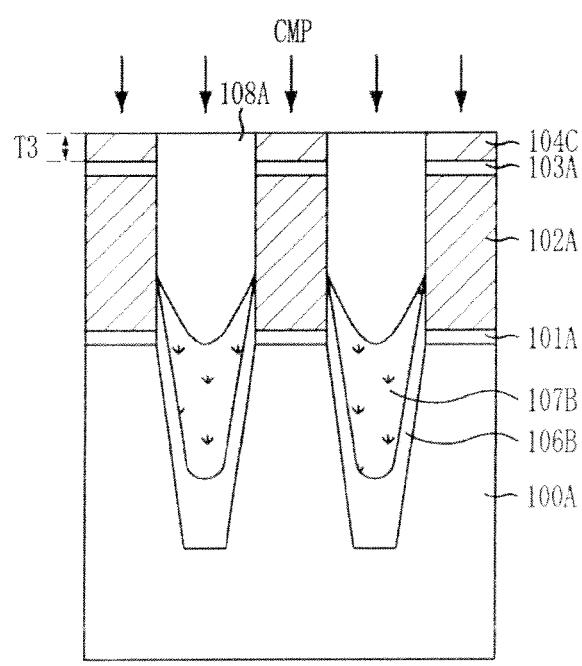
Figure 2A:
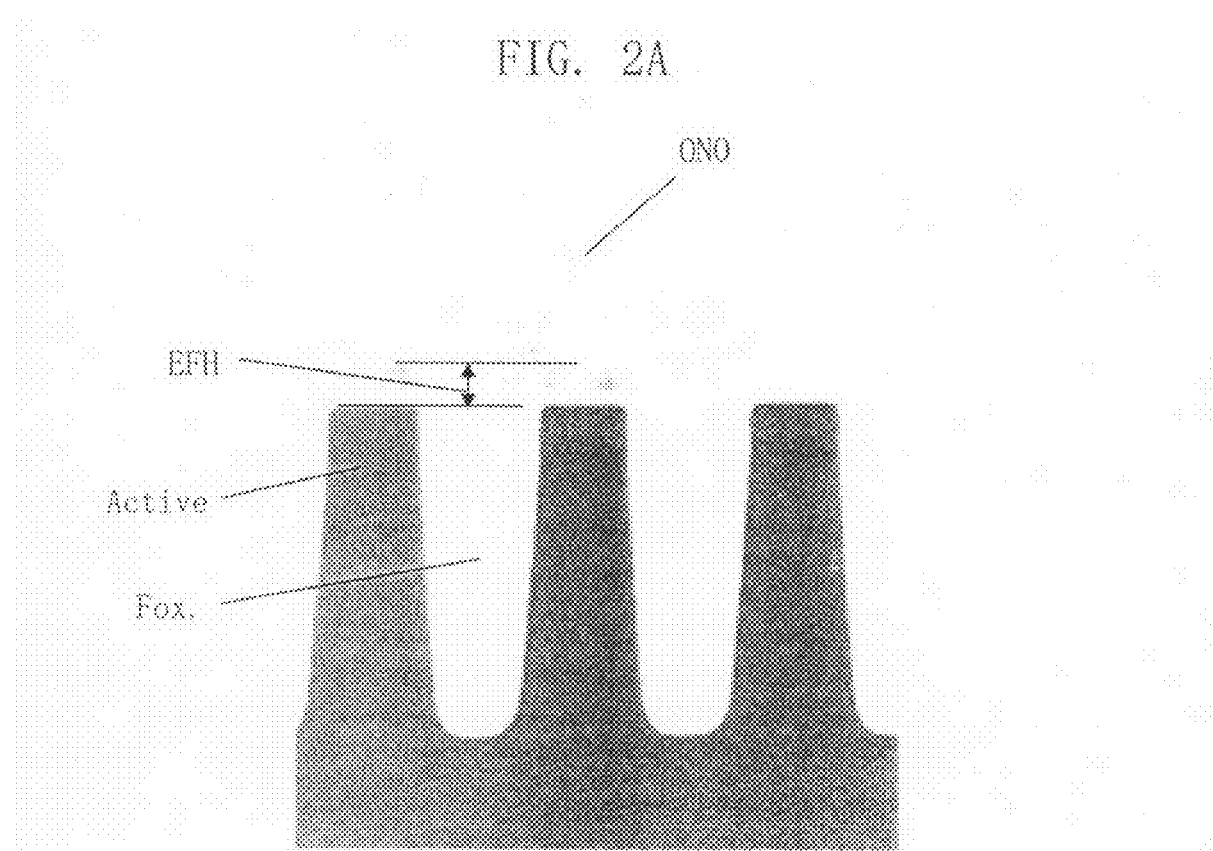
FIGS. 2A and 2B illustrate transmission electron microscopic (SEM) images of cells fabricated through the respective conventional ASA-STI and SA-STI methods.
Figure 2B:
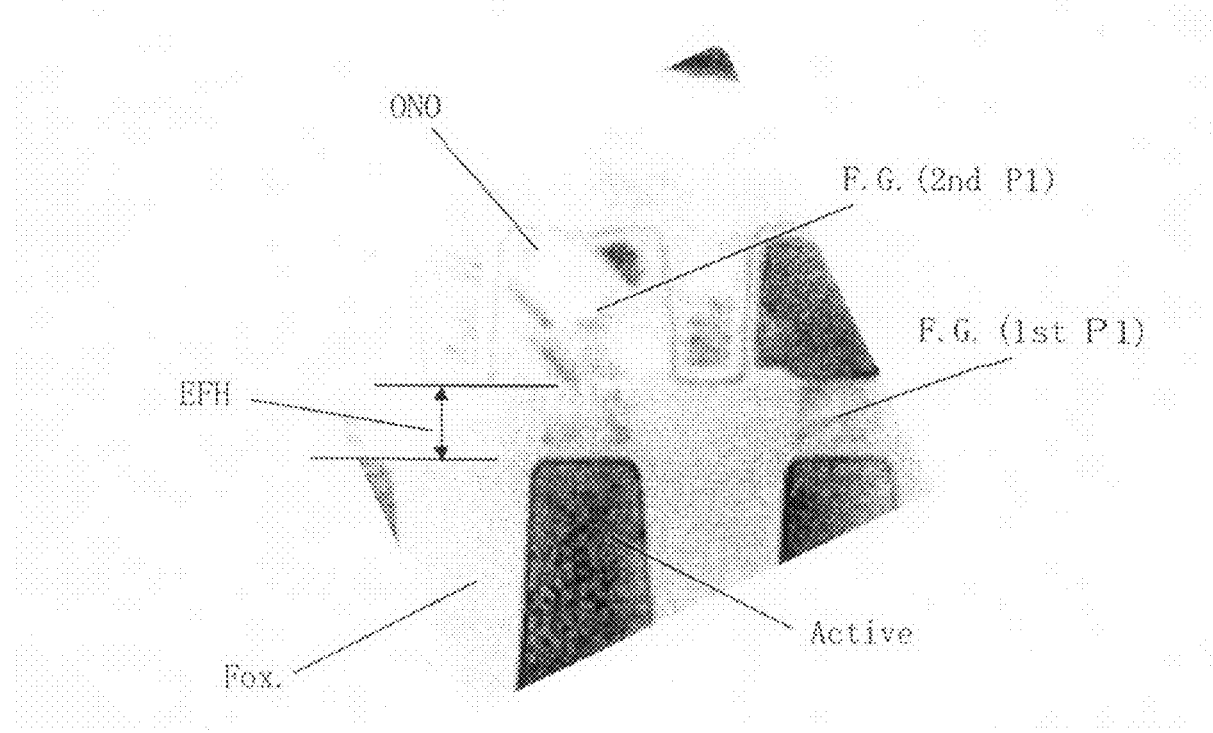
Figure 3:
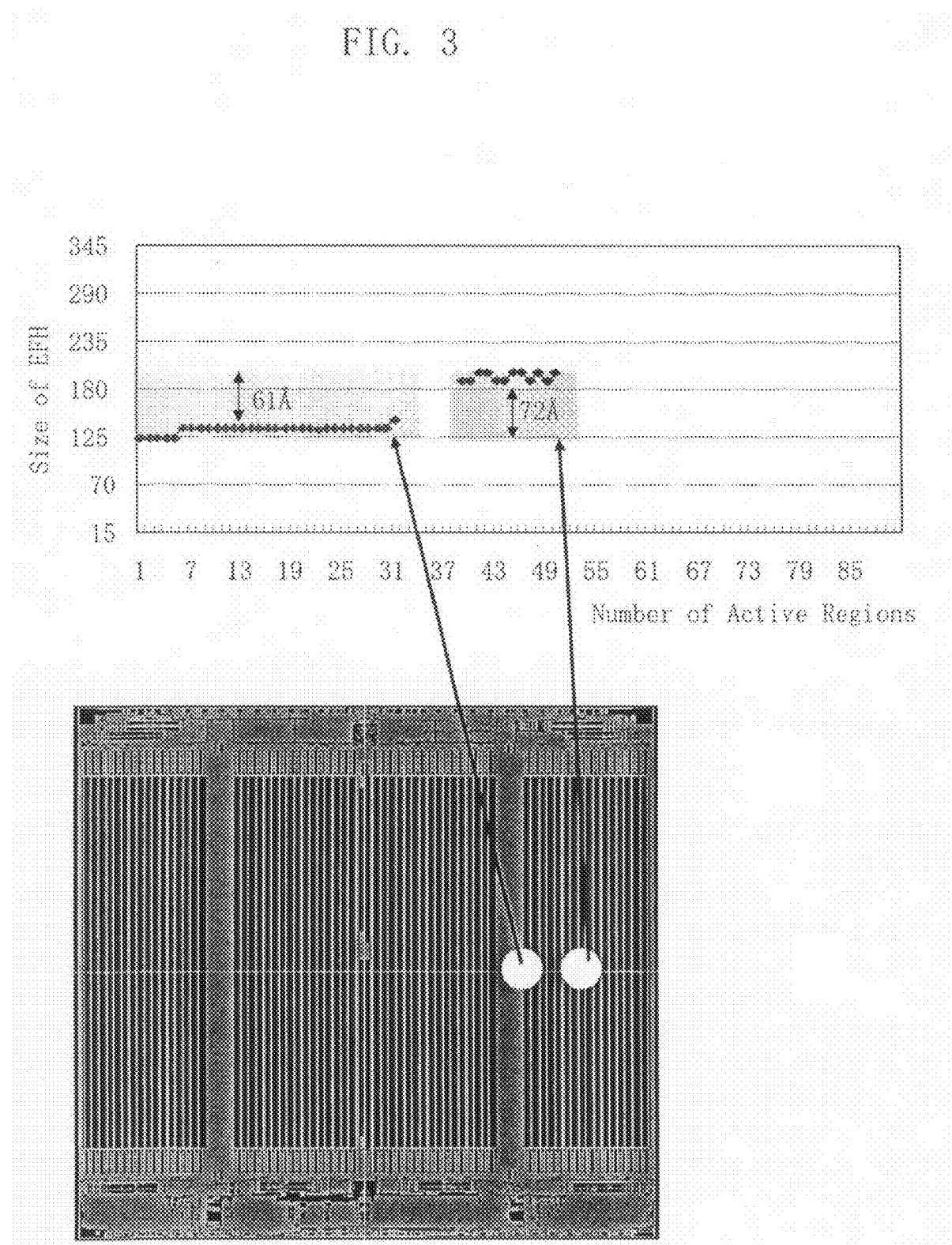
FIG. 3 illustrates a graph of an effective field oxide height (EFH) distribution in a cell region of a cell fabricated through the conventional ASA-STI method.
Figure 4A:
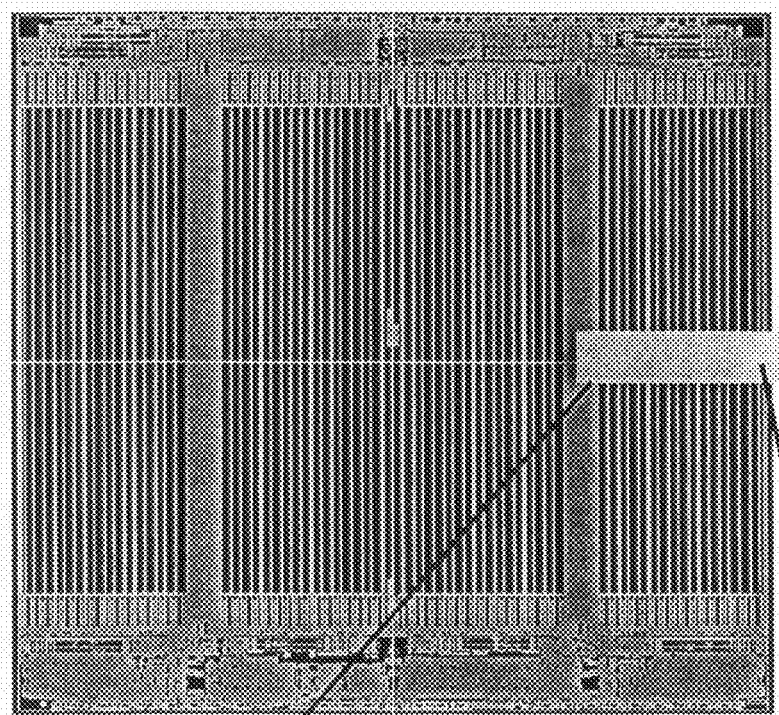
FIG. 4A and 4B illustrate graphs of an EFH distribution within a cell region and a corresponding threshold voltage of a cell fabricated through the conventional ASA-STI method.
Figure 4A:
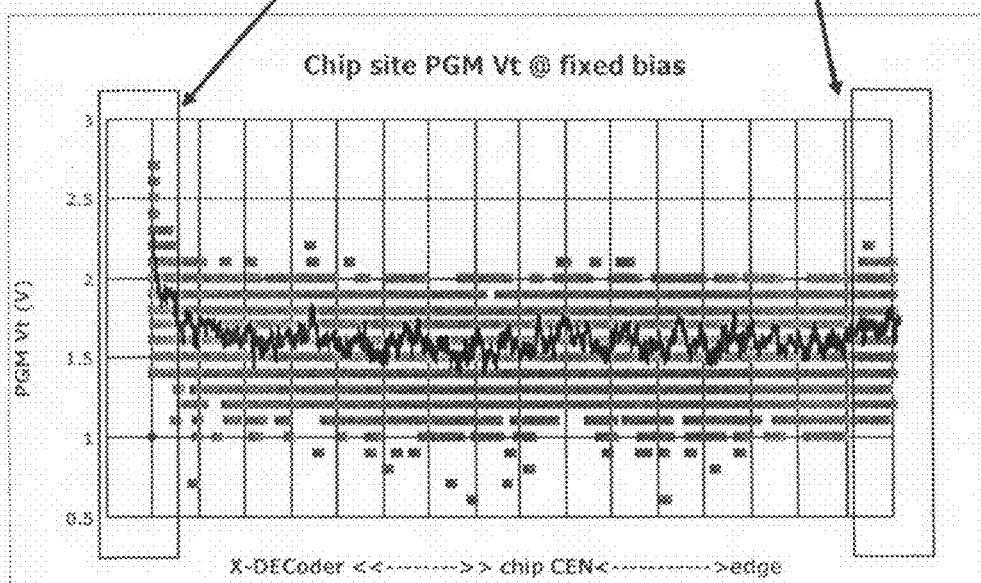
Figure 4B:
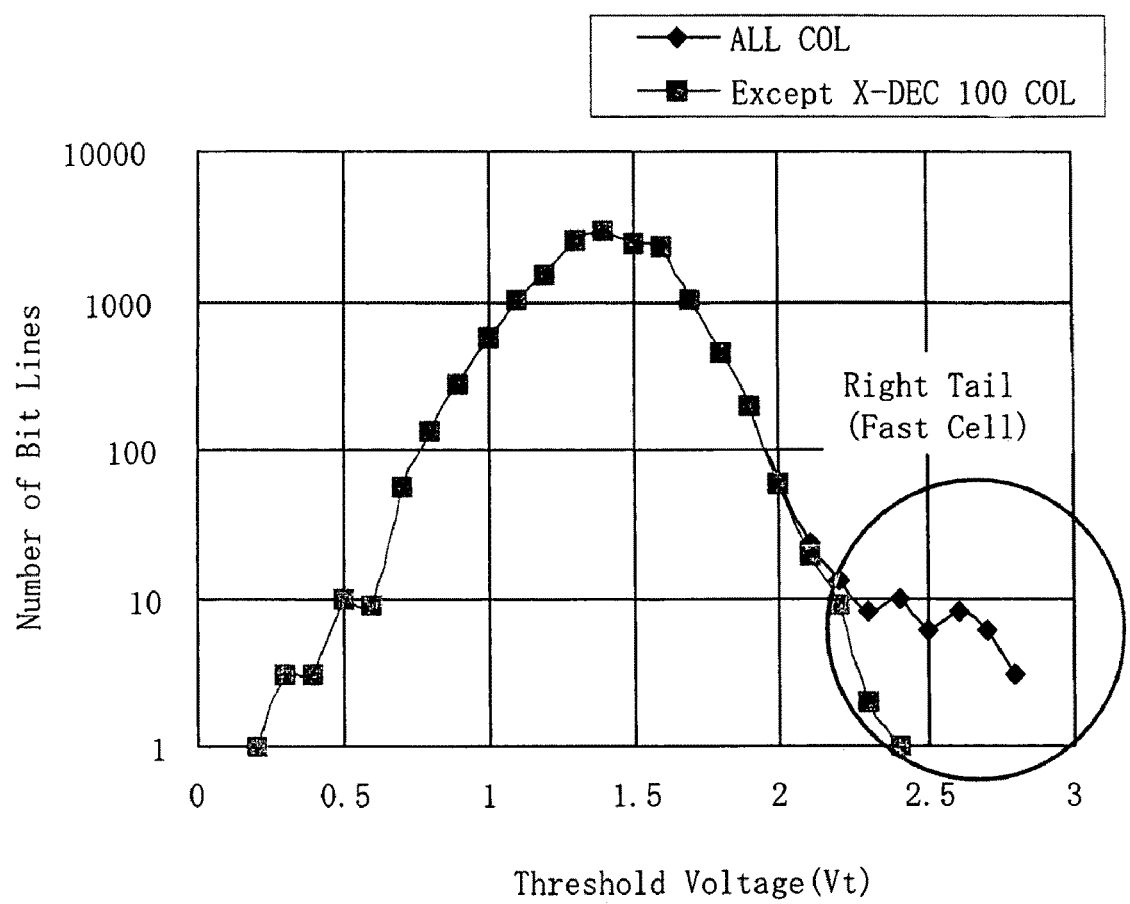
Figure 5A:
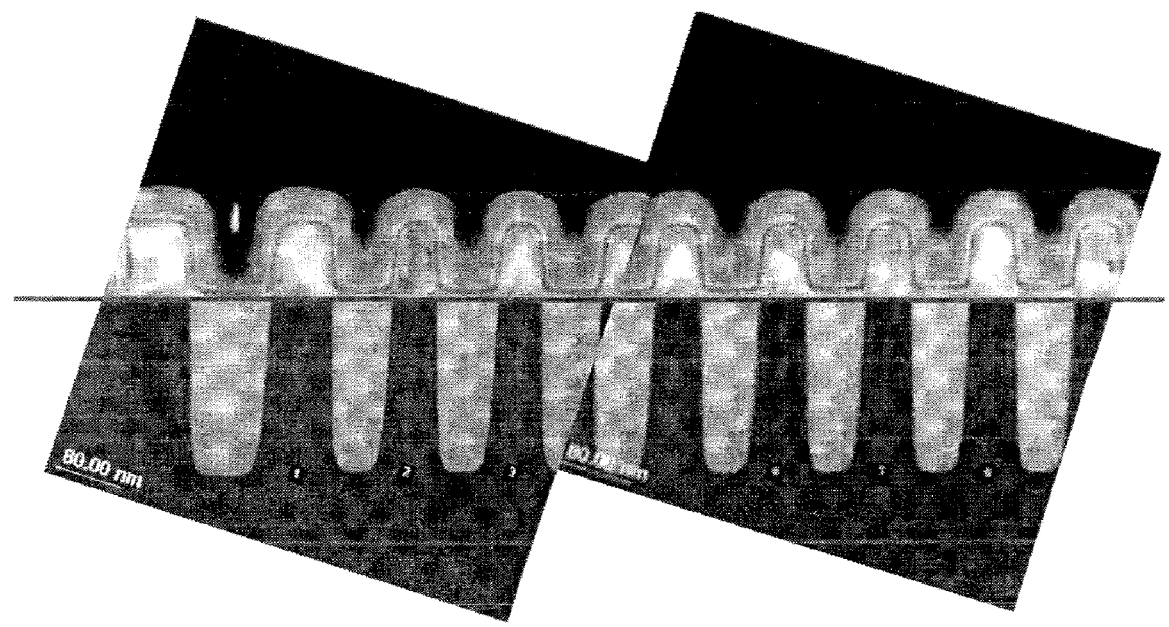
FIG. 5A and 5B illustrate TEM images of edge and central portions of a cell region.
Figure 5B:
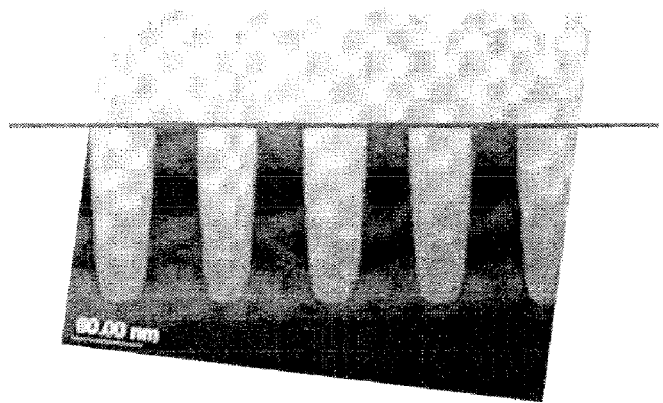
Figure 6:
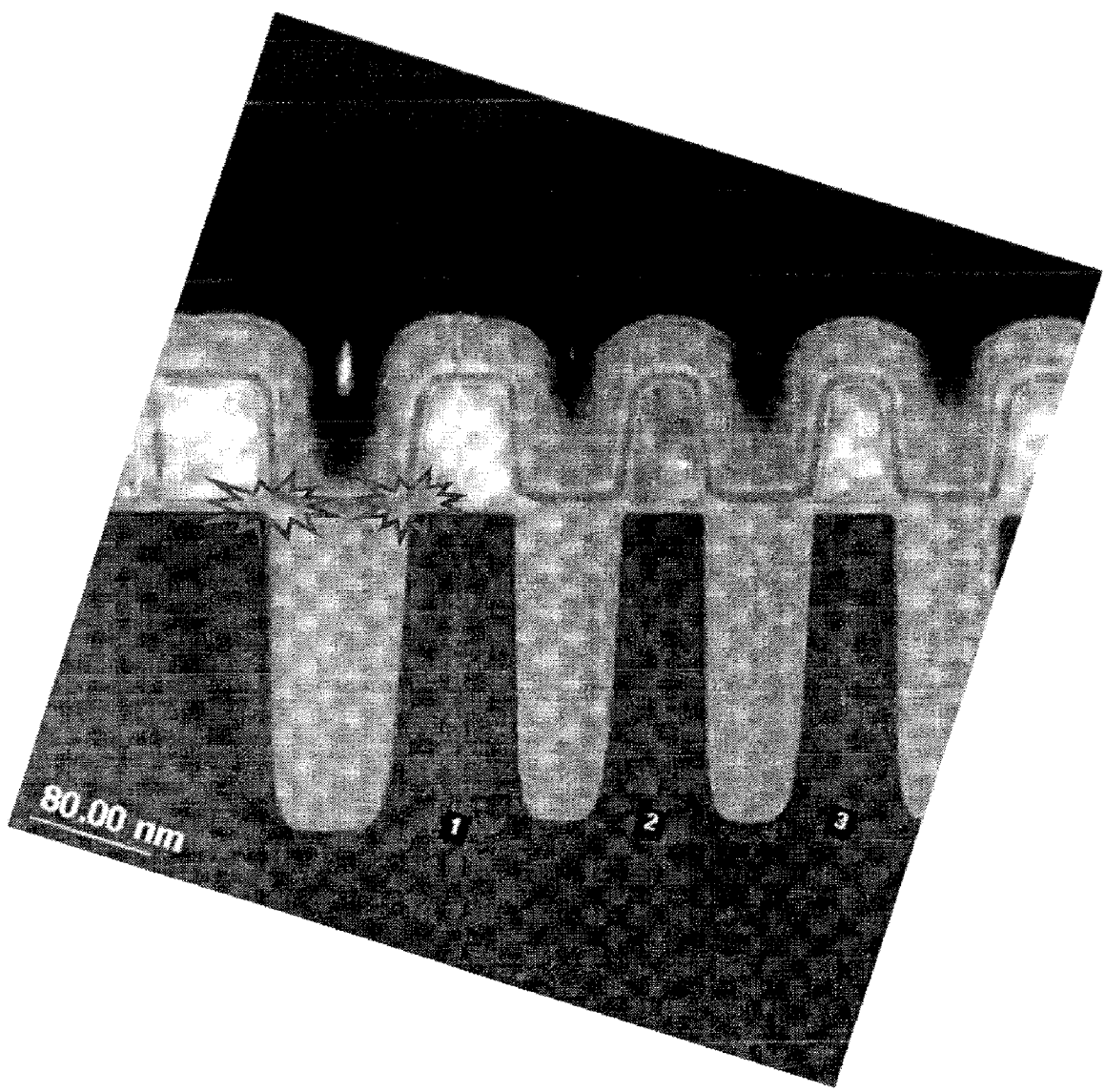
FIG. 6 illustrates a TEM image of a cell showing limitations associated with a decrease in EFH.

However, in the illustrated embodiment, each CMP is performed using a different polish stop layer. More specifically, when the CMP is performed to form the planarized first insulation layer 209A, the patterned second sacrificial layer 206A serves as a polish stop layer, and when the CMP is performed to form the planarized second insulation layer 212A, the patterned first sacrificial layer 204A serves as a polish stop layer. Therefore, the thickness T11 of the patterned first sacrificial layer 204A illustrated in FIG. 7G is substantially the same as the thickness T1 of the patterned pad nitride layer 104A illustrated in FIG. 1C. However, the thickness T12 of the remaining first sacrificial layer 204B is larger than the thickness T3 of the second remaining pad nitride layer 104C illustrated in FIG. 1F.

Since the patterned first sacrificial layer 204A is used as the polish stop layer once, the patterned first sacrificial layer 204A is exposed less frequently compared to the conventional method in which the pad nitride layer is exposed to two CMP steps. Thus, it is possible to improve EFH uniformity.

The illustrated embodiment of the invention provides the following effects. First, when the isolation structure is formed in a structure including double sacrificial layers, non-uniformity in the EFH can be minimized throughout the wafer region. As a result, uniformity of a threshold voltage can be improved. Second, the implementation of the dual sacrificial layers for the isolation structure prevents a reduction in the EFH in the cell region. As a result, it is possible to prevent the occurrence of a punch-through event in a dielectric layer. Based these effects, a programming or erasing operation is not likely to fail, thereby improving the reliability the manufactured devices.

While the invention has been described with respect to various embodiments, it will be apparent to those skilled in the art that various changes and modifications may be made without departing from the spirit and scope of the invention as defined in the following claims. For instance, although various embodiments show the exemplary devices implemented with the ASA-STI method, these embodiments are only illustrative for the simplicity of the description. The embodiments can be implemented with any fabrication method of a device having an isolation structure including multiple layers.

What is claimed is:

1. A method for fabricating a nonvolatile memory device, the method comprising:
   forming a gate insulation layer, a first gate conductive layer, a first sacrificial layer, and a second sacrificial layer over a substrate;
   etching the first and second sacrificial layers, the first gate conductive layer, the gate insulation layer, and the substrate to form trenches;
   forming a first insulation layer to fill the trenches;
   polishing the first insulation layer using the etched second sacrificial layer as a polish stop layer;
   removing the second sacrificial layer;
   recessing the first insulation layer inside the trenches;
   forming a second insulation layer to fill a space produced inside the trenches by the recessing of the first insulation layer; and
   polishing the second insulation layer using the etched first sacrificial layer as a polish stop layer.

2. The method of claim 1, further comprising, after forming the first gate conductive layer, forming a first buffer layer over the first gate conductive layer.

3. The method of claim 2, further comprising, after forming the first sacrificial layer, forming a second buffer layer over the first sacrificial layer.

4. The method of claim 3, wherein the first buffer layer and the first sacrificial layer comprise different materials.

5. The method of claim 3, wherein the second buffer layer and the second sacrificial layer comprise different materials.

6. The method of claim 3, wherein the first and second buffer layers each comprise an oxide-based material.

7. The method of claim 6, wherein the first and second sacrificial layers each comprise a nitride-based material.

8. The method of claim 1, further comprising, after polishing the second insulation layer, recessing the second insulation layer using the etched first sacrificial layer as an etch barrier.

9. The method of claim 8, further comprising, after forming the trenches, forming a liner layer to fill a portion of the trenches.

10. The method of claim 9, wherein the liner layer and the second insulation layer each comprise a high density plasma layer.

11. The method of claim 9, wherein the first insulation layer comprises a spin-on glass layer.

12. The method of claim 8, wherein the step of etching to form the trenches comprises:
   forming a hard mask layer over the second sacrificial layer;
   forming an anti-reflective coating layer over the hard mask layer;
   etching the anti-reflective coating layer and the hard mask layer to form a hard mask pattern; and
   etching the second sacrificial layer, the first sacrificial layer, the first gate conductive layer, the gate insulation layer, and the substrate using the hard mask pattern.

13. The method of claim 12, wherein the hard mask layer is a single layer structure comprising an oxide-based material or a stack structure comprising an oxide-based material and an amorphous carbon-based material.

14. The method of claim 13, wherein the anti-reflective coating layer comprises a silicon oxynitride (SiON).

15. The method of claim 8, wherein the steps of polishing the first and second insulating layers comprise performing chemical mechanical polishing.

16. The method of claim 8, further comprising, after recessing the second insulation layer:
   removing the etched first sacrificial layer;
   forming a dielectric layer over the etched substrate where the etched first sacrificial layer is removed; and
   forming a second gate conductive layer over the dielectric layer.

17. The method of claim 16, wherein the first and second gate conductive layers each comprise one selected from the group consisting of polysilicon, transition metals, and rare earth metals.

18. A method for fabricating a nonvolatile memory device including a cell region and a peripheral region, the method comprising:
   forming a gate insulation layer, a first gate conductive layer, a first sacrificial layer, and a second sacrificial layer over a substrate including the cell region and the peripheral region;
   etching the first and second sacrificial layers, the first gate conductive layer, the gate insulation layer, and the substrate to form trenches;
   forming a first insulation layer to fill the trenches;
   polishing the first insulation layer using the etched second sacrificial layer as a polish stop layer;
   removing the patterned second sacrificial layer;
   recessing the first insulation layer to a specified thickness inside the trenches;
   forming a second insulation layer to fill a space in the trenches produced by the recessing of the first insulation layer;
   polishing the second insulation layer using the etched first sacrificial layer as a polish stop layer; and
   recessing the second insulation layer formed in the cell region using the patterned first sacrificial layer as an etch barrier.

19. The method of claim 18, further comprising, after forming the first conductive layer, forming a first buffer layer over the first gate conductive layer.

20. The method of claim 19, further comprising, after forming the first sacrificial layer, forming a second buffer layer over the first sacrificial layer.

21. The method of claim 20, wherein the first buffer layer and the first sacrificial layer comprise different materials, and the second buffer layer and the second sacrificial layer comprise different materials.

22. The method of claim 20, wherein the first and second buffer layers each comprise an oxide-based material, and the first and second sacrificial layers each comprise a nitride-based material.

23. The method of claim 18, further comprising, after forming the trenches, forming a liner layer to fill the trenches.

24. The method of claim 23, wherein the first insulation layer comprises a spin-on glass layer, and liner layer and the second insulation layer each comprise a high density plasma layer.

25. The method of claim 18, wherein the step of etching to form the trenches comprises:
   forming a hard mask layer over the second sacrificial layer;
   forming an anti-reflective coating layer over the hard mask layer;

etching the anti-reflective coating layer and the hard mask layer to form a hard mask pattern; and etching the second sacrificial layer, the first sacrificial layer, the first gate conductive layer, the gate insulation layer, and the substrate using the hard mask pattern.

26. The method of claim 25, wherein the hard mask layer is a single layer structure comprising an oxide-based material or a stack structure comprising an oxide-based material and an amorphous carbon-based material.

27. The method of claim 26, wherein the anti-reflective coating layer comprises a silicon oxynitride (SiON).

28. The method of claim 18, wherein the steps of polishing the first and second insulating layers comprise performing chemical mechanical polishing.

29. The method of claim 18, further comprising, after recessing the second insulation layer:

removing the etched first sacrificial layer;

forming a dielectric layer over the etched substrate where the etched first sacrificial layer is removed; and forming a second gate conductive layer over the dielectric layer.

* * * * *